US011313826B2

(12) United States Patent
Subramanian et al.

(10) Patent No.: US 11,313,826 B2
(45) Date of Patent: Apr. 26, 2022

(54) INTEGRATED CHEMICAL SENSOR (71) Applicant: INTERNATIONAL BUSINESS MACHINES CORPORATION, Armonk, NY (US)

(72) Inventors: Chitra Subramanian, Putnam, NY (US); Sufi Zafar, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 400 days.

(21) Appl. No.: 16/393,928

(22) Filed: Apr. 24, 2019

(65) Prior Publication Data
US 2020/0340942 A1 Oct. 29, 2020

(51) Int. Cl.
*G01N 27/414* (2006.01)
*G01N 27/327* (2006.01)
*G01N 27/416* (2006.01)
*H01L 29/08* (2006.01)
*H01L 29/73* (2006.01)

(52) U.S. Cl.
CPC ....... *G01N 27/4145* (2013.01); *G01N 27/327* (2013.01); *G01N 27/4162* (2013.01); *H01L 29/0821* (2013.01); *H01L 29/7302* (2013.01)

(58) Field of Classification Search
CPC . H01L 29/0821; H01L 29/7302; H01L 29/73; H01L 29/0804; H01L 29/082; H01L 29/0843; H01L 27/00; G01N 27/327; G01N 27/414; G01N 27/4145; G01N 27/4162
See application file for complete search history.

(56) References Cited

U.S. PATENT DOCUMENTS

| 9,546,977 | B1 | 1/2017 | DiCarlo et al. | |
|---|---|---|---|---|
| 9,564,429 | B2 | 2/2017 | Cai et al. | |
| 9,625,409 | B1 | 4/2017 | Cai et al. | |
| 2016/0153932 | A1 | 6/2016 | Eklund et al. | |
| 2016/0334362 | A1* | 11/2016 | Liu | H01L 23/345 |
| 2017/0023967 | A1* | 1/2017 | Lee | G05F 3/262 |
| 2017/0347928 | A1 | 12/2017 | Doris et al. | |

(Continued)

OTHER PUBLICATIONS

Zafar et al., IEEE, 2016, 389-392. (Year: 2016).*

(Continued)

*Primary Examiner* — Gurpreet Kaur
(74) *Attorney, Agent, or Firm* — Intelletek Law Group, PLLC; Gabriel Daniel, Esq.

(57) ABSTRACT

An integrated chemical sensor device includes a chemical sensor comprising at least one transistor and having an external sensing surface electrically coupled to a node of the at least one transistor. There is an initialization circuit connected to the base of the at least one transistor configured to set an operating point for the at least one transistor. There is a temperature sensor control circuit coupled to the chemical sensor circuit. The temperature sensor includes a temperature sensor, an analog-to-digital (A/D) converter coupled to the temperature sensor, and a proportional-to-absolute-temperature (PTAT) circuit configured to generate a PTAT reference voltage for temperature compensation. The temperature sensor control circuit is configured to compensate for a change in temperature of the at least one transistor.

18 Claims, 10 Drawing Sheets

(56) References Cited

U.S. PATENT DOCUMENTS

2018/0006116 A1   1/2018   Ning et al.
2018/0057785 A1   3/2018   Cahan et al.

OTHER PUBLICATIONS

Park, J. et al., "Development of High-Performance Fully Depleted Silicon-on-Insulator Based Extended-Gate Field-Effect Transistor Using the Parasitic Bipolar Junction Transistor Effect"; Appl. Phys. Lett. (2012); vol. 101:133703; 5 pgs.

Zafar, S. et al., "Comparison Between Field Effect Transistors and Bipolar Junction Transistors as Transducers in Electrochemical Sensors"; Scientific Reports (2017); vol. 7:41430; 10 pgs.

Zafar, S. et al., "A comparison Between Bipolar Transistor and Nanowire Field Effect Transistor Biosensors"; Applied Physics Letters (2015); vol. 106 :063701; 5 pgs.

* cited by examiner

INTEGRATED CHEMICAL SENSOR

BACKGROUND

Technical Field

The present disclosure generally relates to compact sensors, and more particularly, to integrated chemical sensors for Internet-of-Things (IoT) applications and medical devices.

Description of the Related Art

Today, there are an increasing number of compact low-power sensors for IoT applications including wearable sensors for health and medical monitoring. Such sensors often record and track physical parameters in periodic or continuous monitoring applications, such as temperature, blood pressure, motion, electrocardiogram (ECG), etc. The sensors may be integrated, for example, with a microprocessor and/or memory for IoT applications.

SUMMARY

According to an embodiment of the present disclosure, an integrated chemical sensor device includes a chemical sensor circuit and a temperature control circuit. The chemical sensor circuit includes at least one transistor and an external sensing surface electrically coupled to the at least one transistor, and an initialization circuit configured to set an operating point for the at least one transistor. The temperature sensor control circuit is coupled to the chemical sensor circuit and includes an analog-to-digital converter (ADC). The temperature sensor circuit is configured to compensate for a change in temperature of the at least one transistor.

In one embodiment, the at least one transistor is a bipolar junction transistor (BJT), and a voltage from a base to an emitter (Vbe) of the BJT is modulated by a voltage bias from the external sensing surface.

In one embodiment, the at least one BJT comprises a parasitic BJT integrated in a CMOS structure of the chemical sensor circuit.

According to an embodiment of the present disclosure, a wearable integrated chemical sensor device includes a chemical sensor circuit and a temperature control circuit. The chemical sensor circuit includes at least one parasitic bipolar junction transistor (BJT) integrated in a CMOS structure of the chemical sensor circuit. An external sensing needle is electrically coupled to the at least one parasitic (BJT). The wearable sensor is coupled to a microcontroller circuit and a transmitter or a transceiver, to transmit data from the chemical sensor circuit.

According to an embodiment of the present disclosure, a parasitic bipolar junction transistor (BJT) is formed in a CMOS structure, and an emitter bias adjust circuit is electrically connected to an emitter of the parasitic BJT. There is an external sensing needle input electrically connected to a base of the parasitic BJT, in which the external sensing needle includes an external surface constructed of a material substance to bind a particular target analyte. A current source provides a constant current to the emitter bias adjust circuit, and a current mirror is configured to transfer the current from the parasitic BJT to a load electrically connected to a collector of the parasitic BJT. A comparator having a first input received from the load, and a second input that receives a reference input based on a temperature, and the comparator provides a sensor output based on a change in the current to the load caused by a change in the input voltage to the base of the parasitic BJT. In addition, an initialization circuit sets an operating point for the emitter current of the parasitic BJT that is temperature invariant.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, an integrated chemical sensor device according to an embodiment of the present disclosure includes a chemical sensor circuit and a temperature control circuit. The chemical sensor circuit includes at least one transistor and an initialization circuit to set up (i.e. initialize) an operating point of the at least one transistor. A temperature sensor circuit is configured to compensate for a change in temperature of the at least one transistor. In the case where the at least one transistor is a bipolar junction transistor (BJT), a temperature change has a substantial impact on the operation of the BJT, and compensation for temperature change will stabilize operation of the BJT.

In another aspect, a circuit built according to a CMOS process may have one or more intrinsic bipolar junction transistors (BJTs) due to the combination of n-wells, p-wells and substrate in a CMOS structure. Such BJTs are typically referred to as parasitic BJTs, and such parasitic BJTs impact the operability of the circuit. However, in this aspect of the disclosure, parasitic BJTs that intrinsically exist in a circuit built in a CMOS process can be configured to be used to sense pH and chemical ions with relatively lower power usage and a smaller footprint than discrete BJTs.

For example, a bipolar junction transistor BJT-based sensor, (or an FET-based sensor), may sense pH and chemical ions using an external sensing surface that is electrically coupled to, in the case of a BJT, its base terminal. The BJT may be a discrete component, or in one embodiment, a parasitic BJT based on a CMOS technology that provides a low gain and operates at relatively low power supply voltages while providing transducing capabilities for pH and chemical sensing. The parasitic BJT is integrated with the CMOS technology and operates as a type of transducer.

By virtue of the concepts discussed herein, in various aspects, the integrated chemical sensor device according to the present disclosure allows for miniaturization and integration of a chemical sensor with a microprocessor and memory. Reference now is made in detail to the examples illustrated in the accompanying drawings and discussed below.

Figure 1A:
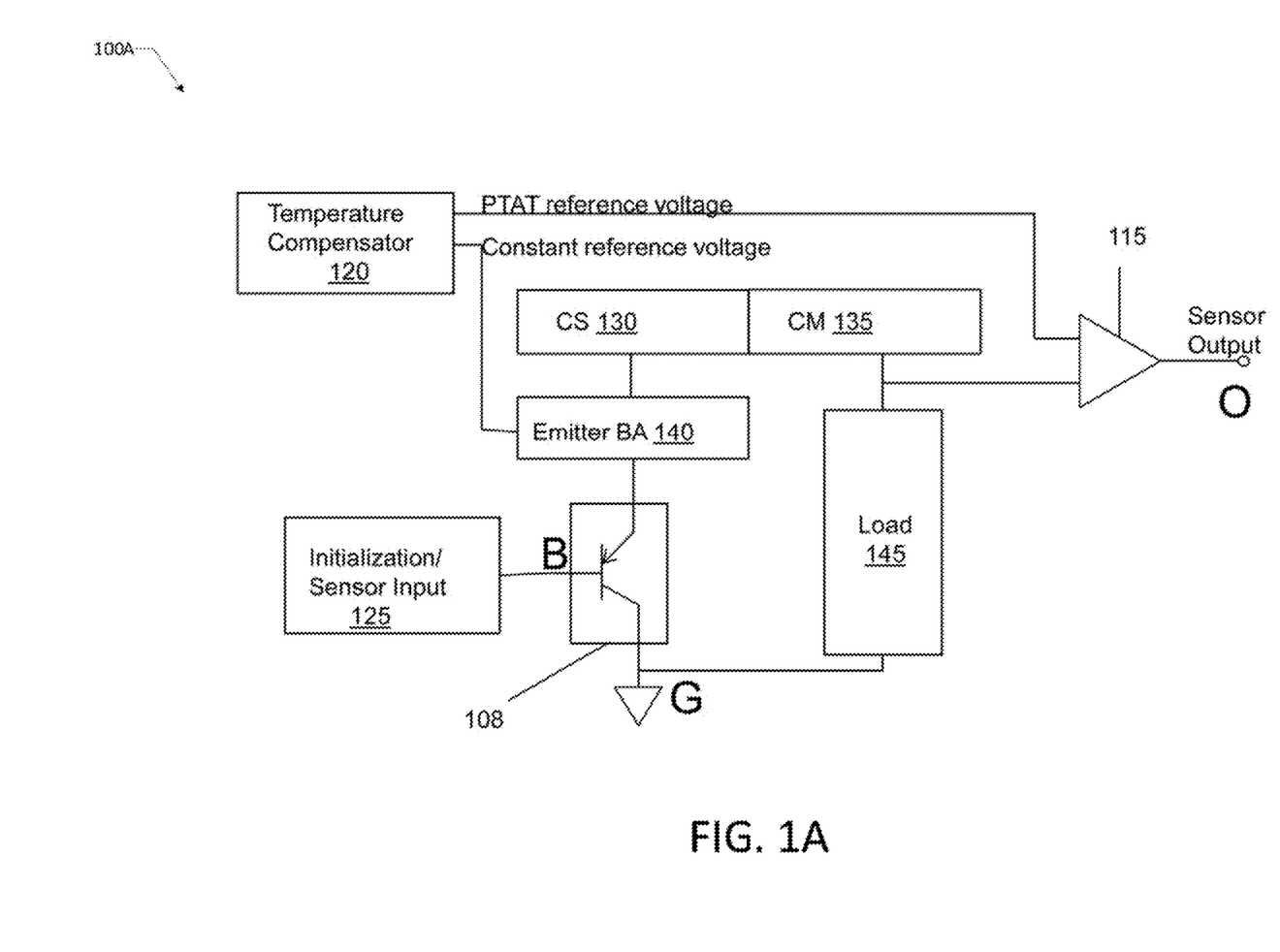
FIG. 1A illustrates a block diagram of a chip circuit block of a chemical sensor device, consistent with an embodiment of the present disclosure.

FIG. 1A illustrates a block diagram of a chip circuit block of a chemical sensor device 100A, consistent with an embodiment of the present disclosure. While this embodiment depicts a BJT 108, the present disclosure is not limited to such structure. For example, other types of transistors, such as a Field Effect Transistor (FET) or Junction Field Effect Transistor (JFET) are just two of the non-limiting possible examples. A temperature compensator 120 provides temperature compensation of the BJT 108 at least during initialization and sensing of the chip block circuit, so that the BJT may operate as a chemical sensor.

With reference to FIG. 1A, "B" identifies the input of the chemical sensor to the base of the BJT 108, "G" is ground, and "O" is the sensor output. The B input, for example, is connected to an external sensing surface, and the external sensing surface is directly in contact with the chemical to be sensed (such as the test solution 107 shown in FIG. 1B). In this embodiment, the B input is connected to the base of the BJT 108 and is used for calibration and initialization of the BJT 108. The temperature compensator circuit 120 controls the emitter bias adjust 140 so that the BJT operates as a relatively stable transducer by keeping the bias current flowing through the BJT 108 at a constant rate. The operating current in the BJT 108 would vary widely without the temperature compensator circuit 120 controlling the emitter bias adjust 140, so the BJT 108 can be operated as a chemical sensor.

In addition, the current source 130 provides a constant current irrespective of voltage or temperature. The current mirror 135 transfers the current from the BJT 108 to the load 145. Given a consistent operating current point, any variation in current with respect to the load is from sensing the input by the initialization/sensor input 125. For example, when the resistance of the test solution 107 changes, the current through the BJT 108 changes, and the change in current through the load 145 is provided as an input to the comparator 115. The comparator 115 also receives a reference value based on temperature to its other input. For example, a Proportional to Actual Temperature (PTAT) reference voltage is provided to the comparator 115. Thus, the BJT is configured to operate as a chemical sensor.

Figure 1B:
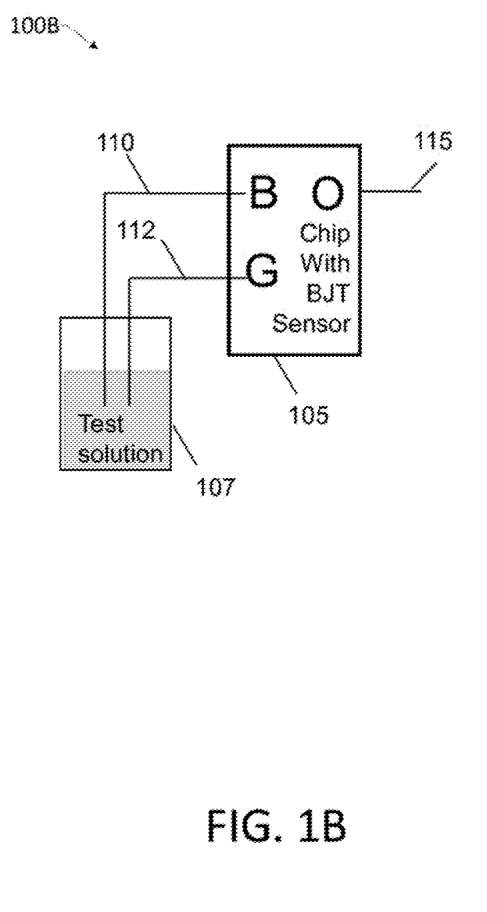
FIG. 1B illustrates an example of an integrated chemical sensor device, consistent with an embodiment of the present disclosure.

FIG. 1B illustrates an example of an integrated chemical sensor device 100B, consistent with an embodiment of the present disclosure. Referring to FIG. 1B, the "B" input is the same as the B input shown in FIG. 1A. The external sensing surface 110 is in contact with the test solution. The "G" input is a ground reference.

The use of a parasitic BJT in this embodiment of the present disclosure permits operation of a relatively low power sensor with significant transducing capabilities, when compared with, for example, discrete BJTs or FETs. The parasitic BJT also has a better gain than, for example, a CMOS transducer, and a smaller size to facilitate the integration of a processor, chemical sensor, and memory. By providing a temperature compensator circuit as discussed herein, the operation of the parasitic BJT is stabilized so that the chemical sensing data is not corrupted by temperature variations affecting operation of the parasitic BJT.

Figure 2A:
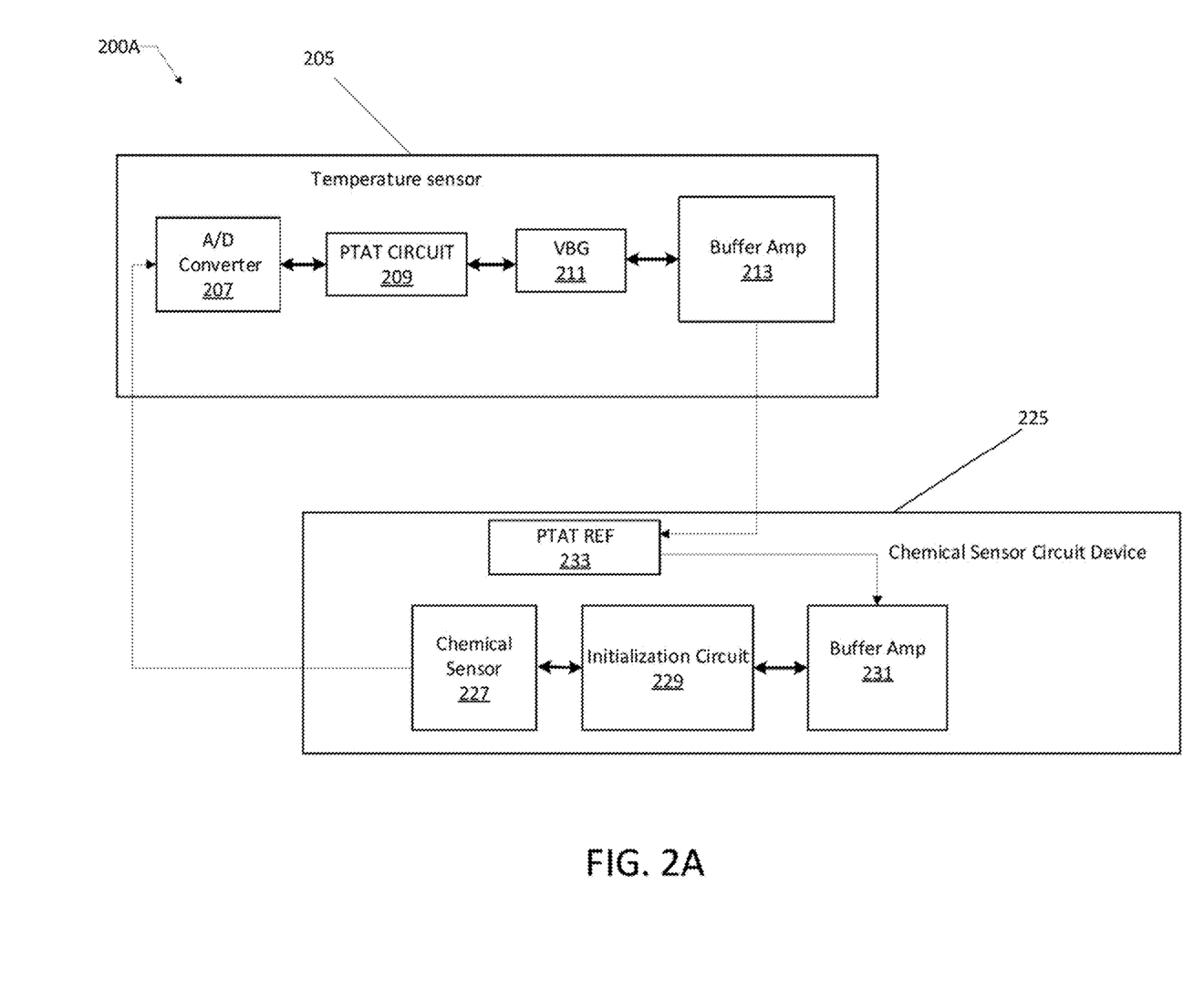
FIG. 2A illustrates a block diagram of chemical sensor blocks, consistent with an embodiment of the present disclosure.

FIG. 2A illustrates a block diagram of chemical sensor blocks 200A, consistent with an embodiment of the present disclosure. FIG. 2A illustrates that a temperature sensor block 205 includes an analog-to-digital (A/D) converter 207. The A/D converter 207 includes components such as a reference level select, a comparator circuit and a latch (not shown). The A/D converter 207, for example, uses taps from a resistor string and the comparator circuit to convert an analog signal to a digital signal. The temperature sensor includes a proportional-to-absolute-temperature (PTAT) circuit 209 that is configured to provide an output of a reference voltage proportional to changes in temperature. Is configured to generate a reference voltage (PTAT ref) and the buffer amp 213 can store values of temperatures The PTAT circuit 209 outputs the proportional reference voltage PTAT (ref) and the VBG 211 outputs a constant reference voltage. Both the PTAT(ref) and the VBG voltage are both used to stabilize operation of the parasitic BJT.

With further regard to the block diagram of FIG. 2A, in the chemical sensor block 225, there is a chemical sensor circuit 227 in which the Vbe of the parasitic BJT is modulated by voltage bias from the interaction of the external sensing surface with a given concentration of a particular analyte. During initialization, the BJT input B is grounded and as the ambient temperature changes, the resulting variation in an initialization circuit (Ic) 229 is used to set a stable operating point for the BJT sensor circuit 227. The initialization circuit 229 is coupled to an input of the parasitic BJT. Thus, the initialization circuit 229 biases the BJT Vbe operating point such that the operation of the BJT is temperature invariant. The PTAT voltage reference compensates for temperature variation in ADC the output.

Figure 2B:
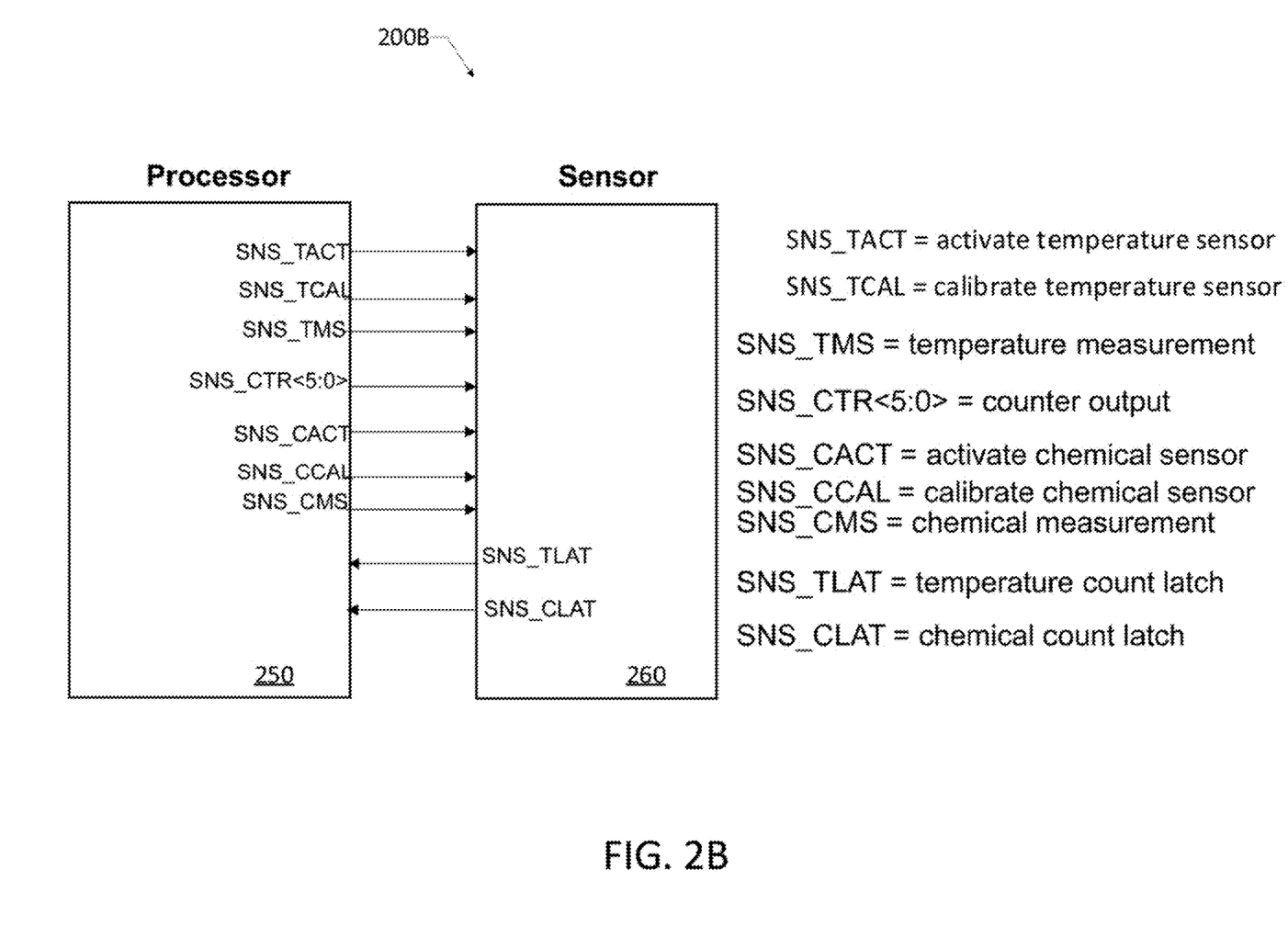
FIG. 2B illustrates an example of a configuration of a processor and an integrated chemical sensor, consistent with an embodiment of the present disclosure.

FIG. 2B illustrates an example of a configuration 200B of a processor and an integrated chemical sensor, consistent with an embodiment of the present disclosure. The processor 250 is configured to send and receive signals from the sensor 260 for calibration, temperature measurement, and chemical sensing. In this embodiment, the sensor 260 is an integrated chemical sensor, such as a BJT-based sensor formed on a CMOS structure. The sensor 260 has at least one parasitic BJT formed on the CMOS structure due to the combination of n-wells, p-wells and substrate in the CMOS structure as discussed previously.

The processor 250 sends signals associated with temperature measurement and chemical sensing to the sensor 260. For example, a signal SNS_TACT activates the temperature sensing, and another signal SNS_TCAL instructs the sensor 260 to perform a self-calibration. A temperature measurement signal (SNS_TMS) is also sent to the sensor 260.

The processor 250 is also configured to send chemical sensing control signals to the sensor 260. For example, the processor 250 sends a signal SNS_CACT to the sensor 260 to activate the chemical sensing. The processor sends signal SNS_CCAL to the sensor 260 so the sensor performs a calibration of the chemical sensor, and perform a chemical measurement (SNS_CMS). The sensor 260 sends a temperature count latch (SNS_TLAT) and/or a chemical count latch (SNS_CLAT) to the processor 250. The SNS-TLAT and SNS_CLAT are data signals sent by the sensor 260 to the processor 250 to provide temperature data and chemical sensing data, respectively.

Figure 3:
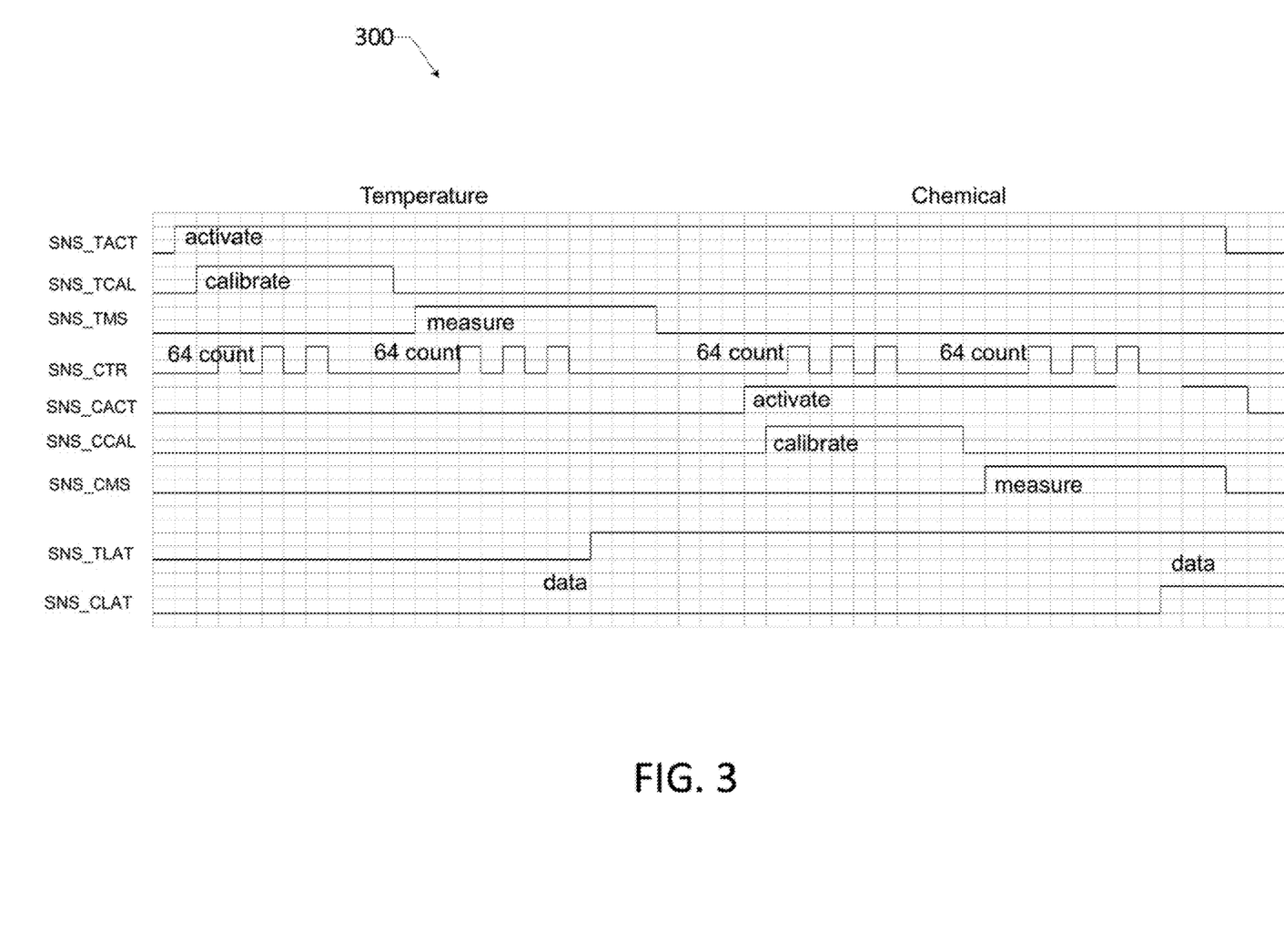
FIG. 3 depicts graphs of signals and timing, consistent with an embodiment of the present disclosure.
Figure 4:
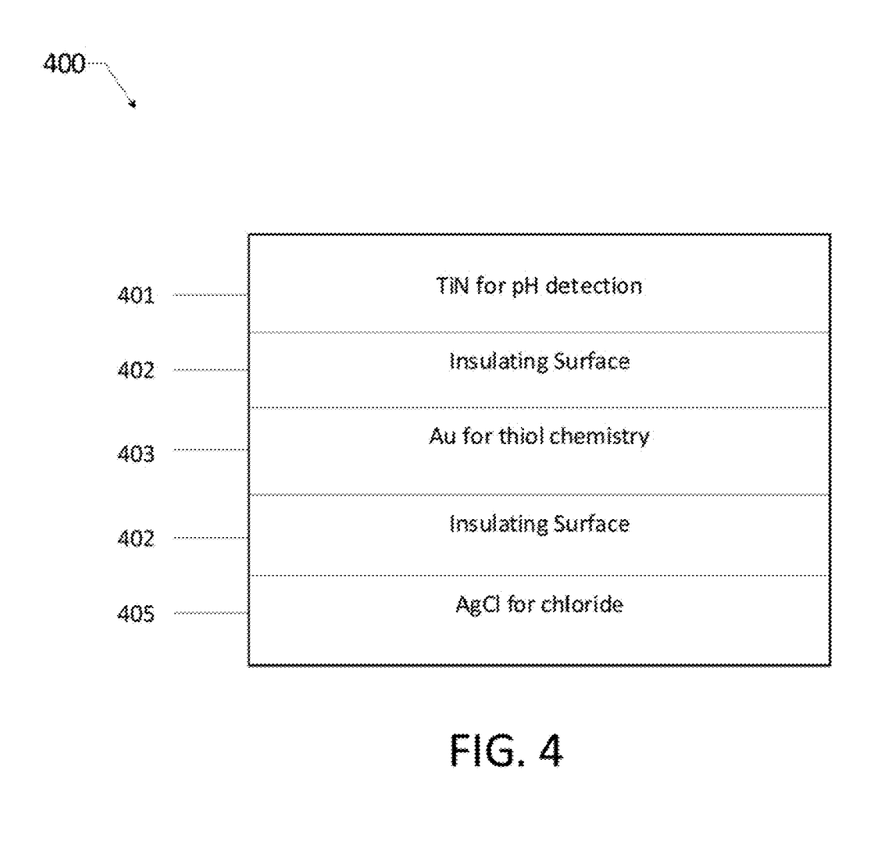
FIG. 4 depicts multiple sensing surfaces deposited on an insulating substrate to detect multiple analytes, consistent with an embodiment of the present disclosure.

FIG. 3 depicts graphs of signals and timing 300 between the processor 250 and the sensor 260, consistent with an embodiment of the present disclosure. FIG. 3 shows the temperature control and chemical sensing commands signals versus time. For example, the activate, calibrate and temperature measure signals are shown in FIG. 3 on the left-hand side. The activate, calibrate and chemical measurement signals are shown in FIG. 3 on the right-hand side FIG. 4 depicts multiple sensing surfaces deposited on an insulating substrate to detect multiple analytes, consistent with an embodiment of the present disclosure. For example, surface 401 in this illustration 400 comprises TiN for pH detection, surface 403 comprises gold (Au) for thiol chemistry detection, with insulating layer 402 there between. Surface 405 comprises silver chloride (AgCl) for chloride detection, and insulating layer 404 is arranged between surface 403 and surface 405. In this embodiment the insulating surfaces 403, 405 comprise the same material, but the present disclosure is not limited to the construction shown in FIG. 4. The types of surfaces shown in FIG. 4 are provided for illustrative purposes, and other various combinations of sensing surfaces may be provided with an integrated chemical sensor device according to the present disclosure. The sensing surfaces are constructed of select substances so that ideally only the target analytes will bind to it. For example, various sensing surfaces can be provided to measure chloride ions, sodium ions, pH ions, potassium ions, just to name a few possible examples. The various types of measurements will depend upon the application of the chemical sensing device, such as health care applications, food processing applications, agricultural applications, etc. The chemical measurements are not limited to ions. For example, such measurements may be of types of proteins, etc. The sensing surfaces, as discussed herein above, are coupled to at least one transistor (for example, coupled to the base of a parasitic BJT) so that a voltage from a base to an emitter (Vbe) of the parasitic BJT is modulated by a voltage bias from the external sensing surface due to the detected analytes.

Figure 5:
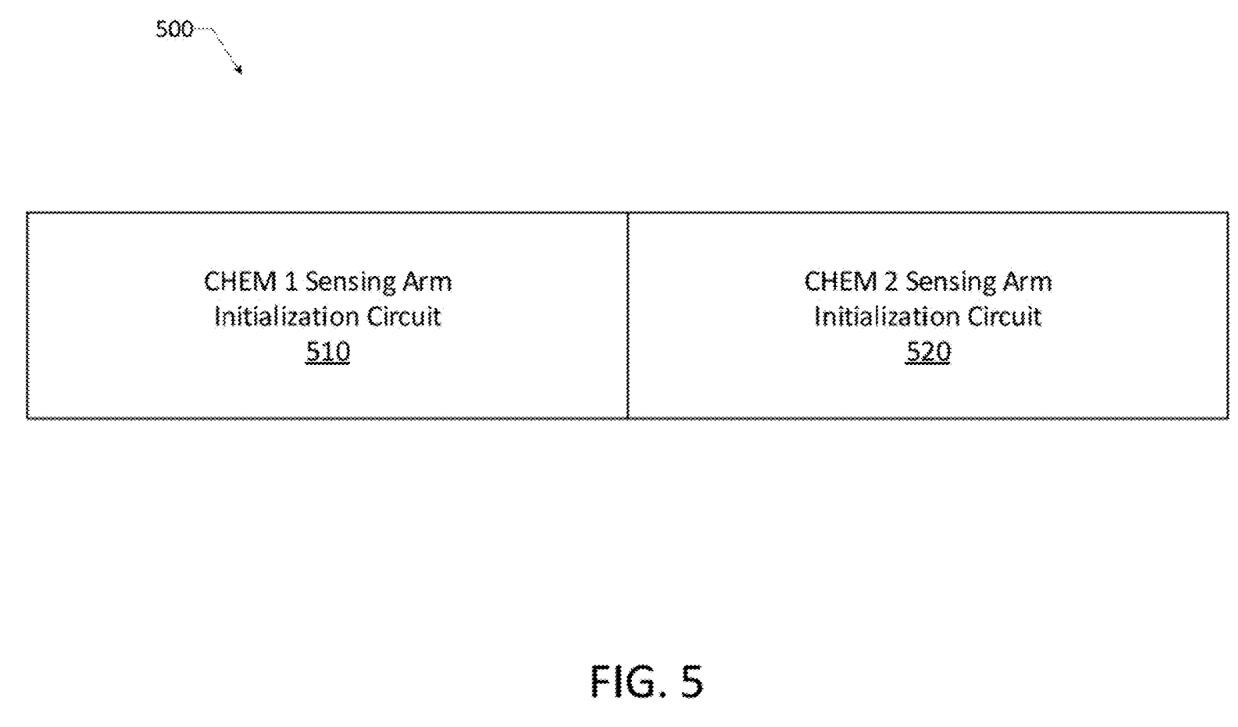
FIG. 5 illustrates an example of multiple chemical sensing arms to detect respective analytes, consistent with an embodiment of the present disclosure.

FIG. 5 is a block diagram of multiple chemical sensing arms 500 to detect respective analytes, consistent with an embodiment of the present disclosure. FIG. 5 shows two chemical sensing arms, chem1 and chem2. Each chemical sensing arm has an independent initialization of the input stage (input initialization 1 and input initialization 2) so that multiple chemicals may be sensed without interference between the input signals. As previously discussed, there can be more than the two chemical sensing arms shown. In addition, in one embodiment, there can be a timed activation of external chemical sensing arms for the integrated chemical sensing device to detect multiple chemicals.

Figure 6:
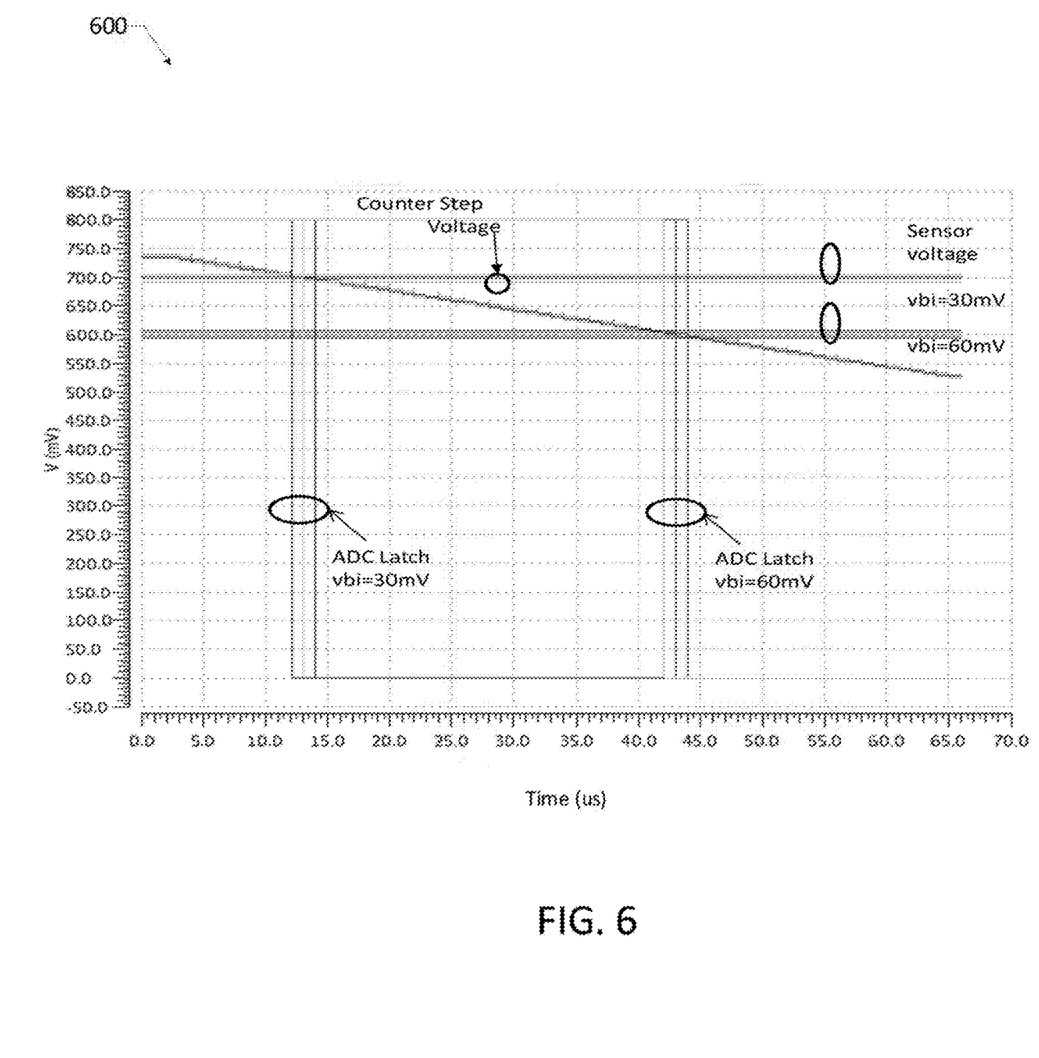
FIG. 6 is a graph showing chemical sensor response time from 20 degrees to 50 degrees Celsius, consistent with an embodiment of the present disclosure.

FIG. 6 is a graph 600 showing chemical sensor response time from 20 degrees to 50 degrees Celsius consistent with an embodiment of the present disclosure. FIG. 6 shows an example where the voltage of the external sensing surfaces (e.g. sensing arms) have 30 mv changes that are detected to make chemical measurements. The various types of external sensing surfaces are electrodes that, for example, when arranged in a chemical solution, can be converted by the ADC latch for detecting concentrations of various chemical substances. In the example of FIG. 6, the values of vbi are 30 mv and 60 mv. The counter step voltages are shown in approximate 1 mv steps. These values of vbi are provided for illustrated purposes and operation of the integrated chemical sensing device is not limited to such values.

Figure 7:
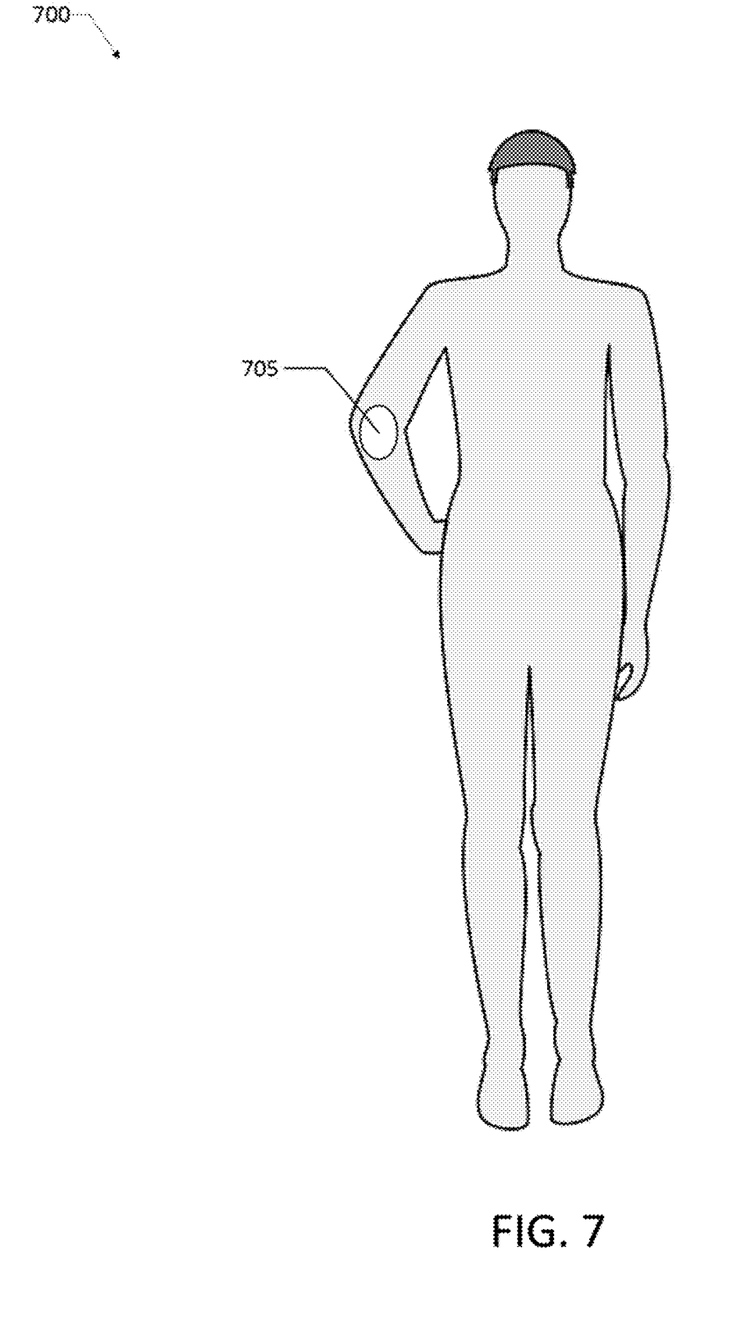
FIG. 7 is an overview of a wearable integrated chemical sensor device consistent with an embodiment of the present disclosure.

FIG. 7 is an overview of a wearable integrated chemical sensor device 705, consistent with an embodiment of the present disclosure. Through the use of a parasitic BJT formed in a CMOS structure, there is realized both reduced size and power requirements for operation. In turn, the reduced size and power requirements permit a medical application of the chemical sensor device 705 that is wearable by a patient to detect chemical concentrations of various substances in perspiration, skin, blood, etc. Such substances may include levels of medication, hormones, potassium levels, etc. The external sensing surfaces in this embodiment may be realized as external sensing needles, with one end of the external sensing needle coupled to the base of a parasitic BJT and the other end in contact with a patient's body. One end of the external sensing needles may be subcutaneously arranged in the patient, or there may be an external sensing needle arranged in the patient. When the wearable device 705 is arranged on the patient, the base of the parasitic BJT receives the input and the Vbe is modulated as discussed herein above with reference to the description of FIG. 2A.

Figure 8:
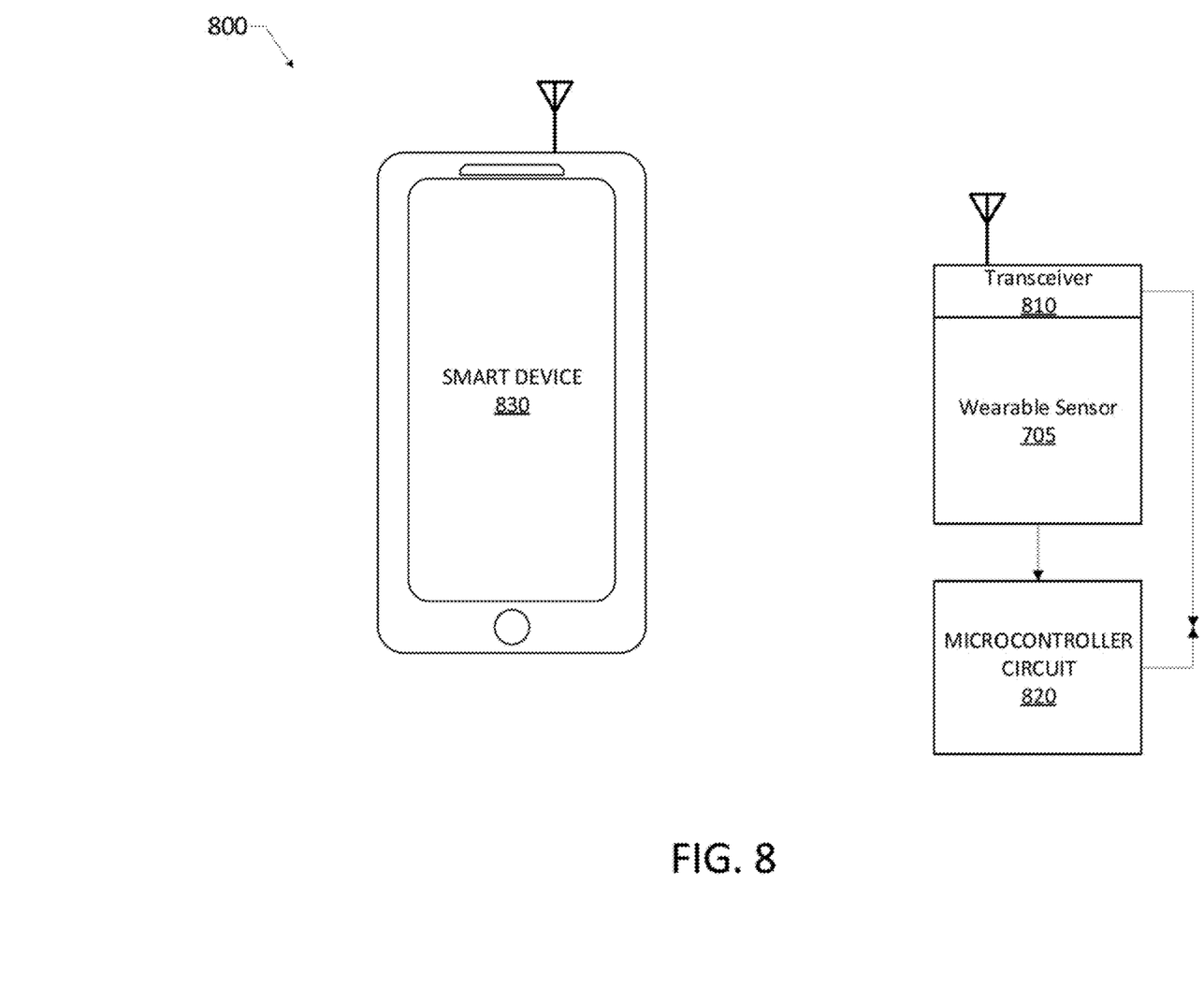
FIG. 8 illustrates a block diagram of the wearable integrated chemical sensor device communicating wirelessly, consistent with an embodiment of the present disclosure.

With reference to FIGS. 7 and 8, the wearable device 705 includes at least a microprocessor/microcontroller circuit 820 and at least one of a wireless transmitter or wireless transceiver 810. Thus chemical sensing data may be wirelessly transmitted to an Access Point in a wireless network, or to a smart device 830, which may be realized as a smartphone, tablet, dedicated health monitoring device, etc. Various wireless protocols may be used, including but not limited to WiFi, Bluetooth, Digital Enhanced Cordless Telecommunications (DECT), Near Field Communication (NFC), ZigBee, etc. In addition to a buffer, the wearable sensor may include a memory that is coupled to the microcontroller 820, as the chemical sensing data may be transmitted periodically or in real time.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. An integrated chemical sensor device comprising:
   a chemical sensor circuit comprising:
      at least one transistor and having an external sensing surface electrically coupled to a node of the at least one transistor;
      an initialization circuit connected to an input of the at least one transistor; and
      an emitter bias adjust circuit coupled to the at least one transistor,
      wherein the initialization circuit is configured to set an operating point for the at least one transistor,
      wherein the at least one transistor comprises a bipolar junction transistor (BJT), and
      wherein a voltage from a base to an emitter (Vbe) of the BJT is modulated by a voltage bias from the external sensing surface,
   a temperature sensor control circuit coupled to the chemical sensor circuit and comprising:
      a temperature sensor;
      an analog-to-digital (A/D) converter coupled to the temperature sensor; and
      a proportional-to-absolute-temperature (PTAT) circuit configured to generate a PTAT reference voltage for temperature compensation,
      wherein the temperature sensor control circuit is configured to compensate for a change in temperature of the at least one transistor, and
      wherein the emitter bias adjust circuit is controlled by the temperature sensor control circuit to compensate for temperature variation.

2. The integrated chemical sensor device according to claim 1, further comprising a plurality of external sensing surfaces separated by an insulating substrate, wherein each one of the plurality of external sensing surfaces comprises a different material, respectively, such that a particular target analyte binds to a particular external sensing surface of the plurality of external sensing surfaces.

3. The integrated chemical sensor device according to claim 1, wherein the BJT comprises a parasitic BJT in a CMOS structure of the chemical sensor circuit.

4. The integrated chemical sensor device according to claim 3, wherein the external sensing surface comprises an external needle having one end coupled to a base terminal of the parasitic BJT and another end configured for contact with a sample for chemical detection.

5. The integrated chemical sensor device according to claim 4, further comprising a plurality of external sensing surfaces each respectively coupled to the parasitic BJT for a predetermined period of time, wherein each one of the external sensing surfaces is configured for sensing a particular chemical.

6. The integrated chemical sensor device according to claim 1, wherein the chemical sensor circuit detects pH and ions in a liquid medium.

7. The integrated chemical sensor device according to claim 1, wherein the chemical sensor circuit detects at least one of DNA or proteins.

8. The integrated chemical sensor device according to claim 7, wherein the at least one transistor comprises a bipolar junction transistor (BJT), and wherein the PTAT reference voltage is output to the BJT to provide a bias voltage.

9. The integrated chemical sensor device according to claim 1, further comprising:
a plurality of parasitic BJTs; and
a plurality of external sensing surfaces respectively coupled to one of the plurality of parasitic BJTs, wherein one external sensing surface is configured to sense a particular chemical.

10. The integrated chemical sensor device according to claim 9, wherein each one of the plurality of parasitic BJTs is configured to be activated independently.

11. The integrated chemical sensor device according to claim 10, wherein when one of the plurality of parasitic BJTs is active, a remainder of the plurality of parasitic BJTs are inactive.

12. A wearable integrated chemical sensor device, comprising:
a chemical sensor circuit comprising:
at least one parasitic bipolar junction transistor (BJT) formed in a CMOS structure;
an external sensing surface electrically coupled to a node of the at least one parasitic BJT;
an initialization circuit coupled to the at least one parasitic BJT transistor and configured to set an operating point for the at least one parasitic BJT transistor;
an emitter bias adjust circuit coupled to the at least one parasitic BJT, wherein a voltage from a base to an emitter (Vbe) of the parasitic BJT is modulated by a voltage bias from the external sensing surface; and
a temperature sensor control circuit coupled to the chemical sensor circuit, comprising:
a temperature sensor;
an analog-to-digital (A/D) converter coupled to the temperature sensor;
a proportional-to-absolute-temperature (PTAT) circuit configured to generate a PTAT reference voltage for temperature compensation;
a microcontroller circuit coupled to the integrated chemical sensor device;
a memory coupled to the microcontroller circuit; and
a wireless transmitter controlled by the microcontroller circuit to transmit chemical sensing data, wherein the emitter bias adjust circuit is controlled by the temperature sensor control circuit to compensate for temperature variation.

13. The wearable integrated chemical sensor device according to claim 12, wherein the external sensing surface comprises at least one external sensing needle coupled at one end to a base of the parasitic BJT.

14. The wearable integrated chemical sensor device according to claim 13, where the external sensing needle is configured at a second end for contact with a body of a patient and operative to detect a concentration of at least one chemical.

15. An integrated chemical sensor device, comprising:
a parasitic bipolar junction transistor (BJT) formed in a CMOS structure;
an emitter bias adjust circuit electrically connected to an emitter of the parasitic BJT;
an external sensing needle input electrically connected to a base of the parasitic BJT, wherein the external sensing needle includes an external sensing surface comprising a material substance configured to bind a particular target analyte, wherein a voltage from a base to an emitter (Vbe) of the parasitic BJT is modulated by a voltage bias from the external sensing surface;
a current source configured to provide a constant current to the emitter bias adjust circuit; a current mirror configured to transfer the current from the parasitic BJT to a load electrically connected to a collector of the parasitic BJT; and
a comparator having a first input coupled to the load, and a second input that is coupled to a temperature-based reference,
wherein the comparator is configured to provide a sensor output based on a change in the current to the load caused by a change in the input voltage to the base of the parasitic BJT, and
wherein the emitter bias adjust circuit is controlled by a temperature sensor control circuit to compensate for temperature variation.

16. The integrated chemical sensor device according to claim 15, further comprising a temperature compensation circuit that is configured to provide (i) a Proportional to Actual Temperature (PTAT) reference voltage to the input of the comparator, and (ii) a constant reference voltage to the emitter bias adjust circuit.

17. The integrated chemical sensor device according to claim 16, wherein one end of the external sensing surface is configured to be in contact with the particular target analyte, and the parasitic BJT is coupled to another end of the external sensing surface such that a voltage from a base to an emitter (Vbe) of the parasitic BJT is configured to be modulated by a voltage bias input from the external sensing surface in contact with the particular target analyte.

18. The integrated chemical sensor device according to claim 16, further comprising an initialization circuit connected to the base of the parasitic BJT, wherein the initialization circuit is configured to set an operating point of the parasitic BJT that is temperature invariant.

* * * * *